United States Patent [19]

Sarma et al.

[11] 4,343,830

[45] Aug. 10, 1982

[54] METHOD FOR IMPROVING THE EFFICIENCY OF SOLAR CELLS HAVING IMPERFECTIONS

[75] Inventors: Kalluri R. Sarma, Tempe; Ronald N. Legge, Scottsdale, both of Ariz.

[73] Assignee: Motorola, Inc., Schaumburg, Ill.

[21] Appl. No.: 206,422

[22] Filed: Nov. 13, 1980

[51] Int. Cl.³ .................. H01L 31/18; B05D 1/38; B05D 5/12

[52] U.S. Cl. ................... 427/38; 204/164; 427/74; 427/75

[58] Field of Search ............ 427/38, 74, 75; 204/164

[56] References Cited

PUBLICATIONS

Semiconductor International, vol. 2, No. 4, p. 16 (May 1979), "New Technique Offers Potential of Doubling Efficiency of Polycrystalline Silicon Solar Cells".

Primary Examiner—James R. Hoffman
Attorney, Agent, or Firm—Joe E. Barbee

[57] ABSTRACT

Method and apparatus for minimizing the deleterious effects of structural imperfections in polycrystalline silicon solar cells uses a high pressure plasma system. The high pressure plasma system is used to introduce atomic hydrogen into the polycrystalline silicon substrates or into polycrystalline silicon solar cells. The silicon can be subjected to the hydrogenation either before or after it has a junction. The high pressure plasma system includes a high pressure chamber having a first and a second auxiliary chamber coupled to the high pressure chamber.

16 Claims, 12 Drawing Figures

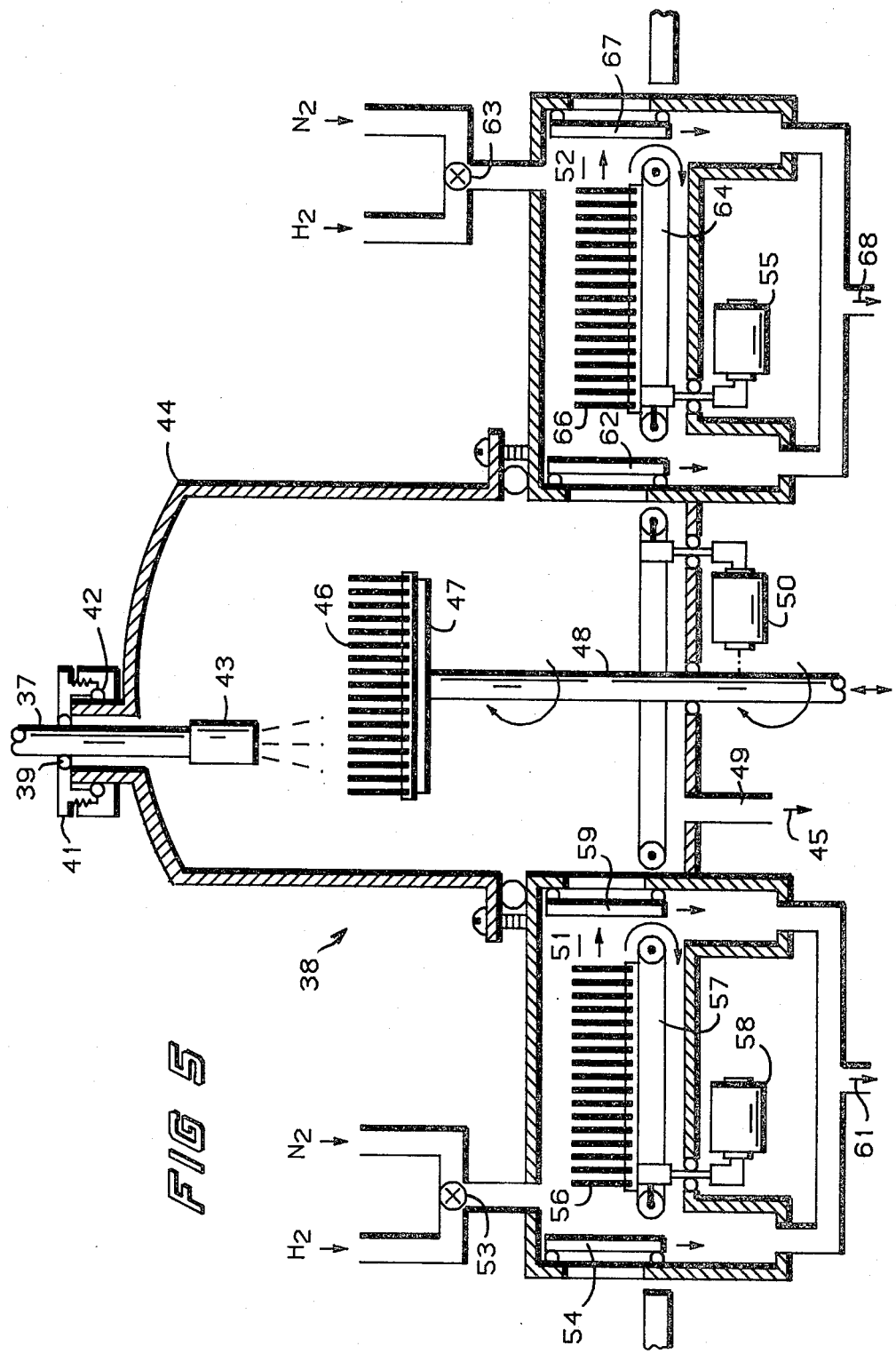

METHOD FOR IMPROVING THE EFFICIENCY OF SOLAR CELLS HAVING IMPERFECTIONS

This invention relates, in general, to silicon solar cells, and more particularly, to a method and apparatus for improving the efficiency of solar cells by minimizing the deleterious effects of structural imperfections.

Presently it appears that polycrystalline silicon solar cells will have the highest probability of success in dramatically reducing the cost of terrestrial photovoltaic power generation if they can be made sufficiently efficient. Because of the minority carrier recombination (loss) at various defects, such as grain boundaries, dislocations, and incoherent twin boundaries, the observed efficiencies in polycrystalline silicon solar cells are rather low.

It is customary to take the polycrystalline silicon and convert it to single crystal silicon by well-known techniques. While the performance (conversion efficiency) of the single crystal silicon solar cells is satisfactory, the cost of single crystal silicon is too high to gain wide acceptance as a replacement for conventional methods of energy generation. Hence, there is currently a large effort devoted to developing new technologies capable of reducing the price of silicon sheets suitable for solar cell fabrication. Unfortunately, all these new and low cost techniques produce silicon sheets with various structural imperfections such as grain boundaries, twin boundaries, and dislocations. All these structural defects act as minority carrier recombination centers and deleteriously effect the performance of the solar cells made using this material. These defects could also act as shunts across the solar p-n junction. As a result, conversion efficiencies observed on polycrystalline silicon solar cells are unacceptably low. To solve this problem, it has been suggested that the minority carrier recombination at the structural defects could be minimized by tying up the dangling bonds associated with these defects by introducing an electropositive element such as atomic hydrogen. This was expected to lead to improved solar cell performance; however, no such improvement in conversion efficiency has heretofore been convincingly demonstrated from use of this atomic hydrogen treatment. Nonetheless, some changes in the material properties such as reduction in grain boundary barrier height and lower p-n junction reverse currents have been reported which seem to indicate the feasibility of this type of passivation. The reason for lack of improvement in efficiency has been postulated as due to the inability to introduce sufficient atomic hydrogen into the material. The technique that was being used was low pressure (approximately 1 to 10 torr) glow discharge hydrogen plasma exposure of several hours to introduce atomic hydrogen into the polycrystalline cells.

Accordingly, it is an object of the present invention to provide a method and apparatus for introducing atomic hydrogen into polycrystalline substrates or polycrystalline silicon solar cells in a more efficient and less expensive manner.

Another object of the present invention is to provide cell processing sequences incorporating hydrogen passivation treatment that leads to higher solar cell conversion efficiencies.

Yet another object of the present invention is to subject solar cell silicon to a high pressure plasma to minimize the deleterious effects of structural imperfections in the silicon.

SUMMARY OF THE INVENTION

In carrying out the above and other objects and advantages of the present invention, there is provided a method for introducing atomic hydrogen into polycrystalline silicon substrates or solar cells and passivating structural imperfections by using a high pressure plasma system.

A high pressure plasma system is used having an RF generator coupled to a network module. Also coupled to the network module is at least a source of hydrogen. The output of the network module is coupled to a nozzle which is inserted into a high pressure enclosure. The high pressure enclosure has a first auxiliary chamber and a second auxiliary chamber. Each of the auxiliary chambers is coupled to the high pressure chamber through an interlock door. The first and second auxiliary chambers are capable of being purged with an inert gas, and supporting means are located inside the high pressure enclosure to support the solar cell silicon.

Other objects and advantages of the invention will become more apparent upon reading the following description taken in conjunction with the accompanying drawings.

BRIEF DESCRIPTION OF THE DRAWINGS

FIG. 5 illustrates a high pressure chamber arrangement useful in the high pressure plasma system of FIG. 4.

DETAILED DESCRIPTION OF THE DRAWINGS

We have discovered that using a high pressure plasma for passivating the defects in polycrystalline silicon solar cells improves the efficiency of such cells. It also happens that there are advantages to using a high pressure plasma; such as, the high pressure plasma system produces hydrogen plasma more efficiency, there is no need for complex vacuum systems, there is a relatively high throughput, and of course the conversion efficiency of the solar cell increases. One example of the improvements resulting from exposing a one centimeter by two centimeter p-n junction polycrystalline solar cell to the high pressure plasma for thirty minutes is shown in the following table. The solar cell temperature during hydrogenation was maintained between 300° C. and 400° C. by adjusting the distance between the plasma nozzle and cell. The solar cell was hydrogenated before deposition of an anti-reflection (AR) coating. When $Si_3N_4$ anti-reflection coating is applied, it typically improves the solar cell performance by approximately 40 percent.

|  | Before Hydrogenation | After Hydrogenation |
|---|---|---|
| $V_{OC}$ (volts) | 0.5075 | 0.5275 |
| $J_{SC}$ (mA/cm$^2$) | 17 | 18.5 |

|  | Before Hydrogenation | After Hydrogenation |
| --- | --- | --- |
| FF (%) | 74.1 | 71.5 |
| η (%) | 6.4 | 6.98 |

Where $V_{OC}$ is the open circuit voltage, $J_{SC}$ is the short circuit current density, and FF is the fill factor, and η is the solar cell efficiency. As can be seen there is an improvement in the efficiency of 0.58%. After $Si_3N_4$ anti-reflection coating is applied, improvements in efficiency would be approximately 0.84%. This illustrates that there is at least an approximately 10% increase in the solar cell efficiency because of the hydrogenation passivation.

Figure 1A:
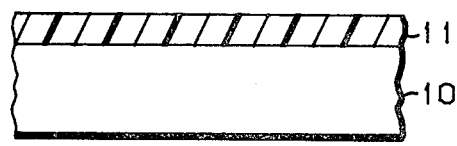
FIGS. 1A through 1C show cross sectional diagrams illustrating one embodiment of the invention.
Figure 1B:
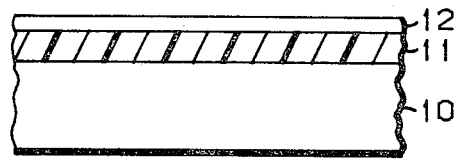
Figure 1C:
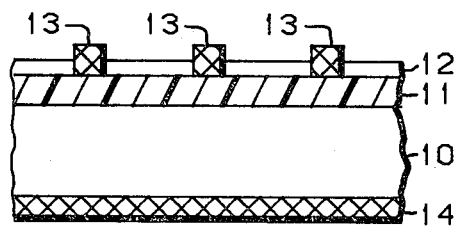

Referring to FIG. 1A through FIG. 1C the process followed can be seen. FIG. 1A illustrates a substrate 10 which can be p-type silicon having an n-type layer 11 formed on substrate 10. N-type layer 11 can be obtained by way of example by diffusing phosphorus on the p-type silicon. Once the junction is formed the device illustrated in FIG. 1A can be passivated in a high pressure hydrogen plasma. The hydrogenation is carried out at a pressure of approximately 760 torr (1 atmosphere). High purity hydrogen is withdrawn from a liquid source and the hydrogenation is carried out at a temperature of between 300° C. to 450° C. As can be seen in FIG. 1B, after the hydrogenation, a $Si_3N_4$ anti-reflection coating 12 is added over layer 11 by a low temperature (<450° C.) process such as by a reaction between silane ($SiH_4$) and ammonia ($NH_3$) in a glow discharge plasma. While $Si_3N_4$ is suggested for anti-reflection coating, several other materials such as SiO, $TiO_2$, $Ta_2O_5$ can be used in place of $Si_3N_4$. A metallization pattern is then defined in anti-reflection coating 12 and the structure is then metallized as shown in FIG. 1C. The metallization pattern is defined in the anti-reflection coating through a well known masking procedure. Metal lines 13 are formed in the metallization pattern and a metal backing 14 is also formed. Although the hydrogenation step occurred prior to anti-reflection coating 12 being provided it should be noted that hydrogenation could just as well been performed after the anti-reflection coating is formed. An important consideration in designing a cell processing sequence is that there should not be any high temperature (>450° C.) steps following the hydrogenation passivation step to ensure that all the hydrogen introduced into the silicon will stay there.

Figure 2A:
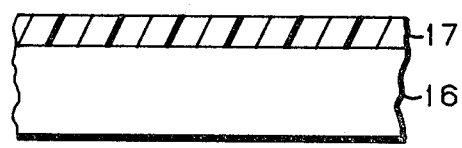
FIGS. 2A through 2C show in cross sectional diagrams another embodiment of the invention.
Figure 2B:
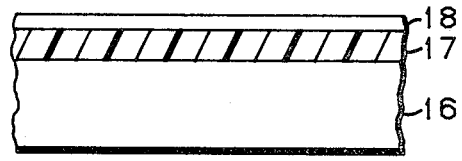
Figure 2C:
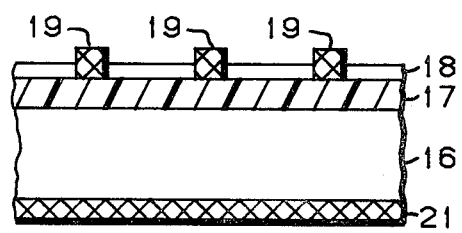

The high pressure hydrogen plasma treatment can also be used in the fabrication of hetero-junction solar cells such as $SnO_2/Si$, $In_xSn_{1-x}O_2/Si$, as illustrated in FIG. 2A through 2C. In this case, the substrate 16, which can be of p-type (or n-type) silicon, can be initially passivated by hydrogenation in a high pressure plasma. At this time the junction can be formed by depositing a layer 17 of the second semiconductor at a temperature not exceeding 450° C. Then an anti-reflection coating 18, is applied in the usual manner. After anti-reflection coating 18 is applied a metallization pattern is defined in the coating so the metal lines 19 as well as metal backing 21 can be added.

Figure 3A:
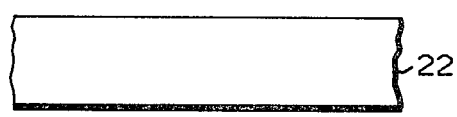
FIGS. 3A through 3D show in cross sectional diagrams yet another embodiment of the invention.
Figure 3B:
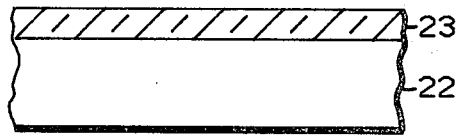
Figure 3C:
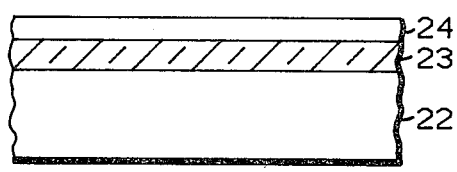
Figure 3D:
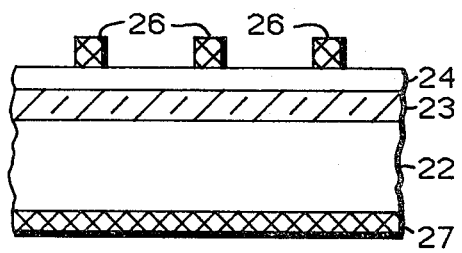

FIGS. 3A through 3D illustrate how the present invention can be used in a metal insulator semiconductor solar cell. FIG. 3A shows a substrate 22 which can be p-type silicon which is initially hydrogenated in a high pressure hydrogen plasma. FIG. 3B shows an oxide 23 being grown on substrate 22. Techniques for growing oxides are well known, such as, by steam or thermal oxidation. Silicon oxide layer 23 can be 50 angstroms in thickness. On top of oxide 23 a Schottky barrier metal layer 24 is added as illustrated in FIG. 3C. Any Schottky barrier metal may be used for layer 24. One such metal is gold which can be added in a 50 angstrom thickness. An anti-reflection coating can be added over Schottky barrier metal layer 24. Once again a metallization pattern must be provided in the anti-reflection layer and then metallization lines 26 and metal backing 27 added to the structure of FIG. 3C to obtain a device as illustrated in FIG. 3D.

The devices illustrated in FIGS. 1, 2, and 3 will exhibit improved efficiencies when a high pressure hydrogen plasma passivation step is included in the device processing sequence.

Figure 4:
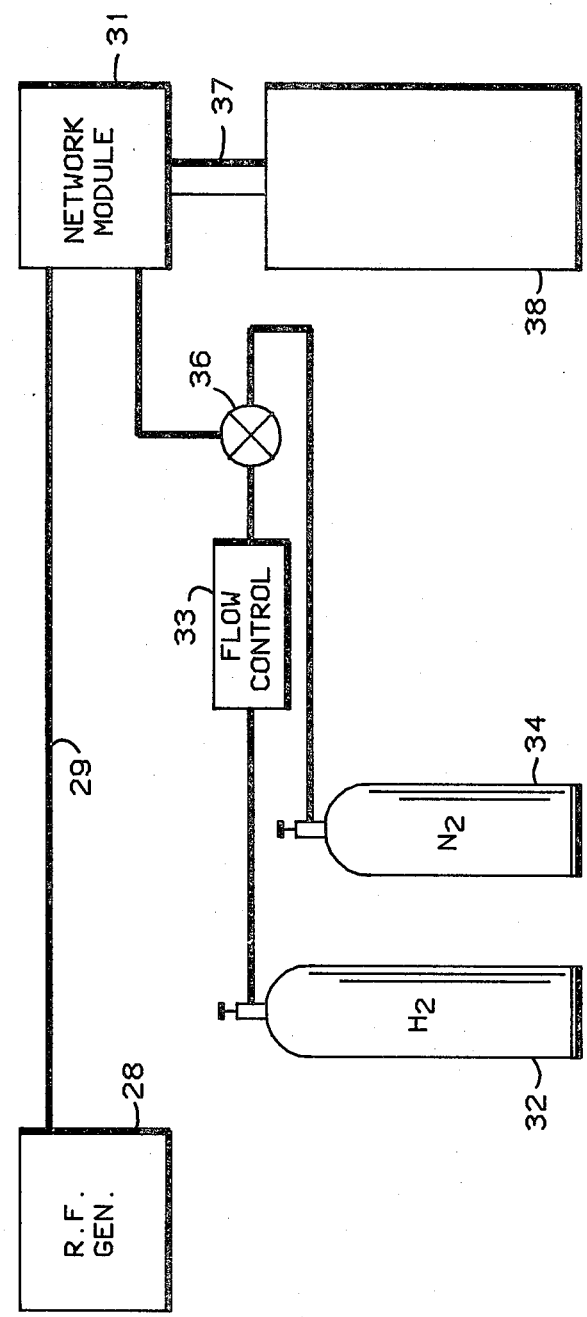
FIG. 4 illustrates schematically a high pressure plasma system.

An apparatus suitable for performing the high pressure plasma passivation is illustrated in FIG. 4. This apparatus is patterned after the high pressure plasma system disclosed in co-pending patent application Ser. No. 148,094, which is assigned to the same assignee as the present application. Said co-pending patent application is hereby incorporated herein by reference. The high pressure plasma system of FIG. 4 has an RF generator 28 which is intended to operate at the FCC approved frequency of 13.56 MHz. The output from RF generator 28 is carried by coaxial line 29 to a network module 31. Network module 31 is an impedance matching module and provides an output to a dual flow nozzle for sustaining a high pressure plasma beam. Network module 31 along with the dual flow nozzle is described in greater detail in the hereinbefore mentioned co-pending patent application. The dual flow nozzle is coupled to network module 31 by line 37. The dual flow nozzle is located in high pressure chamber 38. The power rating of RF generator 28 depends upon the particular application; however, a five kilowatt generator is considered to be sufficient for the high pressure plasma system while obtaining a satisfactory throughput rate.

Hydrogen for the high pressure plasma system is obtained from a liquid hydrogen source 32 which is connected to a flow control 33. The output of flow control 33 is connected to a control valve 36. Control valve 36 also receives nitrogen from container 34. The purpose of nitrogen source 34 is to purge high pressure chamber 38 with an inert gas prior to allowing the hydrogen to enter high pressure chamber 38. Purging of chamber 38 is for safety reasons.

One possible embodiment of high pressure chamber 38 is illustrated in FIG. 5. Line 37 from network module 31 is shown terminated in dual flow nozzle 43 inside of high pressure container 44. Container 44 is illustrated as being a quartz bell jar type of structure. Line 37 enters high pressure container 44 through a threaded cap 41 having a hole therethrough which is sealed by a seal 39. Threaded cap 41 compresses an O-ring or gasket 42 in order to maintain the pressure integrity of container 44. In the high pressure container illustrated, nozzle 43 is offset from the center of container 44. Silicon 46 to be hydrogenated is placed on a quartz platform 47 which is supported by shaft 48. Shaft 48 is capable of being rotated during the high pressure plasma passivation process so that all of silicon 46 is properly exposed to the plasma. Shaft 48 and platform 47 form a quartz pedestal which is capable of being lowered and raised as well as being rotated by mechanism 50.

Container 44 has an exhaust 49 through which hydrogen, illustrated as flowing outward by arrow 45, is passed to a recovery unit. High pressure chamber 44 has an auxiliary chamber 51 on the left and an auxiliary chamber 52 on the right. An opening between high pressure chamber 44 and auxiliary chamber 51 is controllably sealed by an interlock door 59, while an opening between chamber 44 and auxiliary chamber 52 is controllably sealed by an interlock door 62. Chamber 51 is capable of being purged by a nitrogen source which enters through control valve 53. Once chamber 51 has been purged, control valve 53 is then used to cutoff the nitrogen supplied and hydrogen can be allowed to enter into the chamber. The gases are exhausted from chamber 51 as illustrated by arrow 61.

Silicon 56 is moved from chamber 51 into chamber 44 by sliding on conveyer means 57 which are controlled by mechanism 58. Once silicon has been hydrogenated in chamber 44 it is moved through an opening which is closed by interlock door 62 into auxiliary chamber 52. The hydrogenated silicon 66 is handled by conveyer means 64 which is driven by mechanism 55. Chamber 52 can be purged by nitrogen when control valve 63 is in the proper position. Control valve 63 controls the flow of hydrogen into chamber 52 after chamber 52 has been purged. The purged gases can exit from chamber 52 as illustrated by arrow 68.

The purpose of purging auxiliary chambers 51 and 52 with nitrogen is so that they will be filled with an inert gas. After purging, auxiliary chambers 51 and 52 are filled with hydrogen so that when interlock doors 59 or 62 are opened there will be no intermingling of undesirable gases into chamber 44. Silicon is placed in auxiliary chamber 51 through interlock door 54 and can then be moved into chamber 44 once chamber 51 has been equalized with hydrogen. After the silicon has been hydrogenated or passivated it is moved through interlock door 62 into auxiliary chamber 52 and can then be removed from chamber 52 through interlock door 67.

By now it should be appreciated that there has been provided a method and apparatus for minimizing the deleterious effects of structural imperfections in polycrystalline silicon solar cells which results in an improvement of the efficiency of the solar cells. The method includes passivating a silicon substrate either before or after a junction (p-n junction or Schottky barrier) is formed making sure no high temperature (>450° C.) steps follow the passivation step.

While the invention has been described and illustrated with regard to specific examples, it is not intended that the invention be so limited. It will be appreciated, for example, that the high pressure hydrogen plasma treatment can be used to passivate other polycrystalline solar cells such as from gallium arsenide or cadmium sulphide. Further, techniques other than the ones mentioned can be used for junction formation such as ion implantation. Accordingly, it is intended that the invention embrace all such variations and modifications as fall within the spirit and scope of the present invention.

We claim:

1. A method for minimizing deleterious effects of structural imperfections in polycrystalline silicon solar cells, comprising:
    diffusing a junction on a polycrystalline silicon substrate to form a p-n junction; passivating the p-n junction in a high pressure hydrogen plasma; applying an anti-reflection coating to the diffused portion of the p-n junction; defining a metallization pattern on the anti-reflection coating; and forming a metal conductor in the metallization pattern.

2. The method of claim 1 wherein the substrate is p-type polycrystalline silicon substrate.

3. The method of claim 1 wherein the hydrogen is a high purity hydrogen withdrawn from a liquid source.

4. The method of claim 3 wherein the passivating is carried out in a pressure of substantially 760 torr.

5. The method of claim 1 wherein the anti-reflection coating is $Si_3N_4$.

6. The method of claim 1 wherein the junction is formed by diffusing phosphorous into the substrate.

7. The method of claim 1 wherein the passivating is carried out in a temperature of between 300° C. and 450° C.

8. A method of fabricating a solar cell comprising providing a body of polycrystalline silicon material of one conductivity type, diffusing impurities into said body to produce a region in said body of opposite conductivity type, passivating said body in a high pressure hydrogen plasma of high purity hydrogen at a temperature of approximately 300° C. to 450° C., forming an anti-reflection coating on said body, and forming a metallization pattern in said anti-reflection coating.

9. The method of claim 8 wherein the passivation is carried out in a pressure of approximately 760 torr.

10. A method of minimizing deleterious effects of structural imperfections in solar cells, comprising:
    providing a silicon substrate material of a first conductivity type, passivating the silicon substrate in a high pressure hydrogen plasma, depositing a layer of another semiconductor of a second conductivity type on the silicon substrate, forming an anti-reflection coating on the layer, and forming a metallization pattern in the anti-reflection coating.

11. The method of claim 10 wherein a high purity hydrogen at a temperature of approximately 300° C. to 450° C. is used in a pressure of approximately 760 torr to perform the passivating.

12. A method for minimizing deleterious effects of structural imperfections in solar cells by introducing atomic hydrogen into polycrystalline substrates and passivating structural imperfections using a high pressure plasma system.

13. The method of claim 12 wherein the passivating is carried out at a temperature of approximately 300° C. to 450° C. and at a pressure of approximately 760 torr.

14. A method for minimizing deleterious effects of structural imperfections in silicon, comprising:
    providing a silicon substrate of a first conductivity type; passivating the substrate with a high pressure hydrogen plasma; growing a layer of oxide on the silicon substrate; and adding a Schottky barrier metal layer over the layer of oxide thereby forming a basic solar cell.

15. The method of claim 14 further including forming an anti-reflection coating on the Schottky barrier metal layer, and forming a metallization pattern in the anti-reflection coating.

16. The method of claim 14 wherein the passivating is carried out at a temperature of approximately 300° C. to 450° C. and at a pressure of approximately 760 torr.

* * * * *